(12) United States Patent
Lu

(10) Patent No.: US 10,418,314 B2
(45) Date of Patent: Sep. 17, 2019

(54) EXTERNAL CONNECTION PAD FOR SEMICONDUCTOR DEVICE PACKAGE

(71) Applicant: Advanced Semiconductor Engineering, Inc., Kaohsiung (TW)

(72) Inventor: Wen-Long Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 15/801,108

(22) Filed: Nov. 1, 2017

(65) Prior Publication Data
US 2019/0131231 A1 May 2, 2019

(51) Int. Cl.
*H01L 23/12* (2006.01)
*H01L 21/00* (2006.01)
(Continued)

(52) U.S. Cl.
CPC .... *H01L 23/49838* (2013.01); *H01L 21/4853* (2013.01); *H01L 21/4857* (2013.01); *H01L 21/563* (2013.01); *H01L 23/3157* (2013.01); *H01L 23/481* (2013.01); *H01L 23/49822* (2013.01); *H01L 23/528* (2013.01); *H01L 23/5226* (2013.01); *H01L 24/16* (2013.01); *H01L 24/13* (2013.01); *H01L 24/32* (2013.01); *H01L 24/73* (2013.01); *H01L 24/81* (2013.01); *H01L 24/92* (2013.01); *H01L 24/97* (2013.01); *H01L 2224/131* (2013.01); *H01L 2224/16013* (2013.01); *H01L 2224/16237* (2013.01); *H01L 2224/32225* (2013.01); *H01L 2224/73204* (2013.01); *H01L 2224/81005* (2013.01);
(Continued)

(58) Field of Classification Search
CPC ........... H01L 23/49838; H01L 21/4853; H01L 21/4857; H01L 21/49822; H01L 24/16; H01L 23/49822; H01L 24/06; H01L 21/76877; H01L 23/528; H01L 23/5226; H01L 23/481
See application file for complete search history.

(56) References Cited

U.S. PATENT DOCUMENTS 5,488,014 A * 1/1996 Harada ............... H01L 23/5226
257/E23.145
9,653,336 B2 5/2017 Han et al.
(Continued)

*Primary Examiner* — Alonzo Chambliss
(74) *Attorney, Agent, or Firm* — Foley & Lardner LLP; Cliff Z. Liu

(57) ABSTRACT

At least some embodiments of the present disclosure relate to a substrate for packaging a semiconductor device. The substrate includes a first dielectric layer having a first surface and a second surface opposite to the first surface, a first patterned conductive layer adjacent to the first surface of the first dielectric layer, a second patterned conductive layer adjacent to the second surface of the first dielectric layer and electrically connected to the first patterned conductive layer, and an external connection pad tapered from a top surface to a bottom surface. The second patterned conductive layer includes a pad and a trace adjacent to the pad. The external connection pad is disposed on the pad of the second patterned conductive layer. A bottom width of the external connection pad is greater than or equal to a width of the pad of the second patterned conductive layer.

27 Claims, 17 Drawing Sheets

(51) Int. Cl.
  *H01L 23/498* (2006.01)
  *H01L 23/00* (2006.01)
  *H01L 23/31* (2006.01)
  *H01L 21/48* (2006.01)
  *H01L 21/56* (2006.01)
  *H01L 23/528* (2006.01)
  *H01L 23/48* (2006.01)
  *H01L 23/522* (2006.01)

(52) U.S. Cl.
  CPC ............... *H01L 2224/81815* (2013.01); *H01L 2224/92125* (2013.01); *H01L 2224/97* (2013.01); *H01L 2924/15311* (2013.01); *H01L 2924/3841* (2013.01)

(56) References Cited

U.S. PATENT DOCUMENTS

| | | | |
|---|---|---|---|
| 2011/0147061 A1 | 6/2011 | Leung et al. | |
| 2011/0210451 A1* | 9/2011 | Gambee | H01L 21/31133 257/774 |
| 2012/0153493 A1* | 6/2012 | Lee | H01L 25/16 257/774 |
| 2014/0091473 A1* | 4/2014 | Len | H01L 24/05 257/774 |
| 2014/0146504 A1* | 5/2014 | Hu | H05K 3/007 361/767 |
| 2015/0264817 A1* | 9/2015 | Terui | H05K 1/115 438/107 |

* cited by examiner

| p(um) | t(um) | x(um) | θ |
|---|---|---|---|
| 3 | 2 | 1 | 45.0 |
| 5 | 2 | 1 | 71.6 |
| 8 | 2 | 1 | 80.6 |
| 10 | 2 | 1 | 82.9 |
| 3 | 2 | 1.5 | 33.7 |
| 5 | 2 | 1.5 | 63.5 |
| 8 | 2 | 1.5 | 76.0 |
| 10 | 2 | 1.5 | 79.4 |
| 3 | 2 | 2 | 26.6 |
| 5 | 2 | 2 | 56.3 |
| 8 | 2 | 2 | 71.6 |
| 10 | 2 | 2 | 76.0 |
| 5 | 3 | 1 | 63.5 |
| 8 | 3 | 1 | 78.7 |
| 10 | 3 | 1 | 81.9 |
| 5 | 3 | 1.5 | 53.2 |
| 8 | 3 | 1.5 | 73.3 |
| 10 | 3 | 1.5 | 77.9 |
| 5 | 3 | 2 | 45.0 |
| 8 | 3 | 2 | 68.2 |
| 10 | 3 | 2 | 74.1 |

FIG. 2C

| t(um) | x(um) | θ |
|---|---|---|
| 2 | 1 | 63.5 |
| 3 | 1 | 71.6 |
| 2 | 1.5 | 53.2 |
| 3 | 1.5 | 63.5 |
| 2 | 2 | 45.1 |
| 3 | 2 | 56.3 |

FIG. 3C

| t(um) | x(um) | θ |
|---|---|---|
| 3 | 1 | 71.6 |
| 5 | 1 | 78.7 |
| 8 | 1 | 82.9 |
| 10 | 1 | 84.3 |
| 3 | 1.5 | 63.5 |
| 5 | 1.5 | 73.3 |
| 8 | 1.5 | 79.4 |
| 10 | 1.5 | 81.5 |
| 3 | 2 | 56.3 |
| 5 | 2 | 68.2 |
| 8 | 2 | 76.0 |
| 10 | 2 | 78.7 |

FIG. 3D

EXTERNAL CONNECTION PAD FOR SEMICONDUCTOR DEVICE PACKAGE

BACKGROUND

1. Technical Field

The present disclosure relates to a substrate for a semiconductor device package, and to a substrate having an external connection pad that narrows, or tapers, from a top surface to a bottom surface and disposed on a pad of a patterned conductive layer.

2. Description of the Related Art

As miniaturization of semiconductor device packages progress, quantity and width/pitch of patterned conductive layers (e.g. pads or traces) in a substrate can be made small. This may present some challenges, such as a misalignment issue, a bridging/short-circuit issue, a thickness issue or other issues.

SUMMARY

In some embodiments, according to one aspect, a substrate includes a first dielectric layer having a first surface and a second surface opposite to the first surface, a first patterned conductive layer adjacent to the first surface of the first dielectric layer, a second patterned conductive layer adjacent to the second surface of the first dielectric layer and electrically connected to the first patterned conductive layer, and an external connection pad tapered from a top surface to a bottom surface. The second patterned conductive layer includes a pad and a trace adjacent to the pad. The external connection pad is disposed on the pad of the second patterned conductive layer. A bottom width of the external connection pad is greater than or equal to a width of the pad of the second patterned conductive layer.

In some embodiments, according to another aspect, a semiconductor device package includes a substrate, a semiconductor device, and a connection element. The substrate includes a first dielectric layer having a first surface and a second surface opposite to the first surface, a first patterned conductive layer adjacent to the first surface of the first dielectric layer, a second patterned conductive layer adjacent to the second surface of the first dielectric layer and electrically connected to the first patterned conductive layer, and an external connection pad tapered from a top surface to a bottom surface. The second patterned conductive layer includes a pad and a trace adjacent to the pad. The external connection pad is disposed on the pad of the second patterned conductive layer. A bottom width of the external connection pad is greater than or equal to a width of the pad of the second patterned conductive layer. The semiconductor device is disposed on the substrate and electrically connected to the external connection pad of the substrate. The connection element is disposed adjacent to the first surface of the first dielectric layer and electrically connected to the first patterned conductive layer.

In some embodiments, according to another aspect, a method for manufacturing a semiconductor device package includes: providing a first dielectric layer having a first surface and a second surface opposite to the first surface; forming a first patterned conductive layer adjacent to the first surface of the first dielectric layer; forming a second patterned conductive layer adjacent to the second surface of the first dielectric layer and electrically connected to the first patterned conductive layer, the second patterned conductive layer including a pad and a trace adjacent to the pad; forming an external connection pad on the pad of the second patterned conductive layer, wherein the external connection pad is tapered from a top surface to a bottom surface, and a bottom width of the external connection pad is greater than or equal to a width of the pad of the second patterned conductive layer; disposing a semiconductor device on the external connection pad through an interconnect element; and disposing a connection element on the first patterned conductive layer.

BRIEF DESCRIPTION OF THE DRAWINGS

FIG. 2C illustrates an angle table corresponding to some embodiments of the present disclosure.

FIG. 3C illustrates an angle table corresponding to some embodiments of the present disclosure.

FIG. 3D illustrates an angle table corresponding to some embodiments of the present disclosure.

DETAILED DESCRIPTION

Figure 1A:
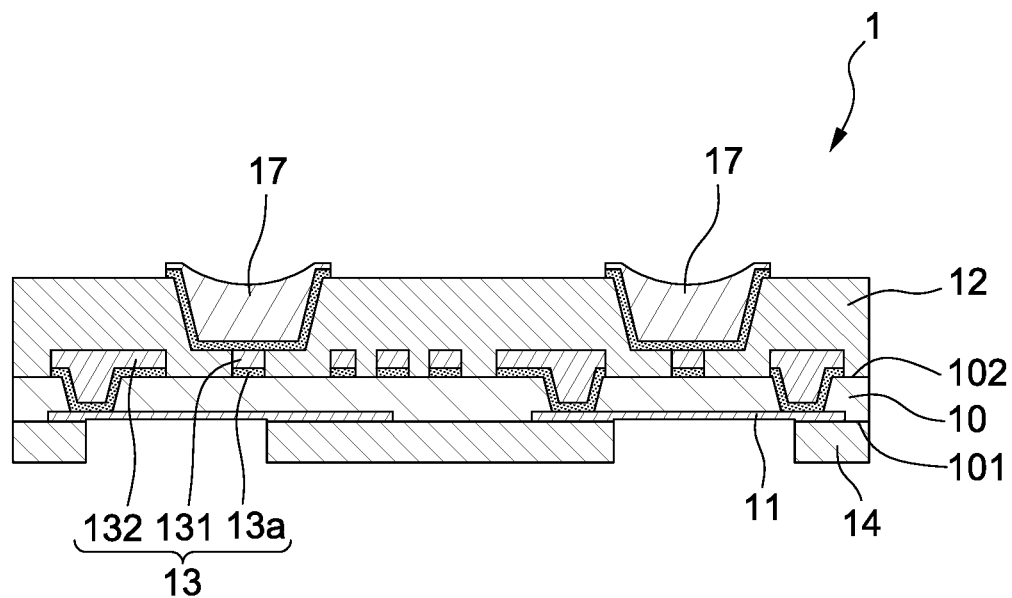
FIG. 1A illustrates a cross-sectional view of a substrate according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

FIG. 1A is a cross-sectional view of a substrate 1 in accordance with some embodiments of the present disclosure. The substrate 1 includes a first dielectric layer 10, a first patterned conductive layer 11, a second dielectric layer 12, a second patterned conductive layer 13, a passivation layer 14 and an external connection pad 17.

The first dielectric layer 10 has a surface 101 and a surface 102 opposite to the surface 101. The first dielectric layer 10 has a thickness ranged from approximately 5 micrometers (µm) to approximately 10 µm. In some embodiments, the first dielectric layer 10 may include an organic layer, such as a solder mask, a polyimide (PI), an epoxy, an Ajinomoto build-up film (ABF), a polypropylene (PP), a molding compound, or a dry film. The first dielectric layer 10 may include an inorganic layer, such as silicon (Si), a glass, or a ceramic.

The first patterned conductive layer 11 is disposed adjacent to the surface 101 of the first dielectric layer 10. The first patterned conductive layer 11 is embedded in the surface 101 of the first dielectric layer 10. A bottom surface of the first patterned conductive layer 11 is partially exposed by the passivation layer 14. The bottom surface of the first patterned conductive layer 11 includes a recessed or sunken portion (e.g. which is exposed by the passivation layer 14).

The passivation layer 14 is disposed on the surface 101 of the first dielectric layer 10. The passivation layer 14 defines an opening to expose the sunken portion of the first patterned conductive layer 11. A width of the opening may be approximately equal to a width of the sunken portion of the first patterned conductive layer 11. The passivation layer 14 has a thickness ranged from approximately 7 µm to approximately 13 µm. In some embodiments, the passivation layer 14 may be a solder mask.

Figure 1B:
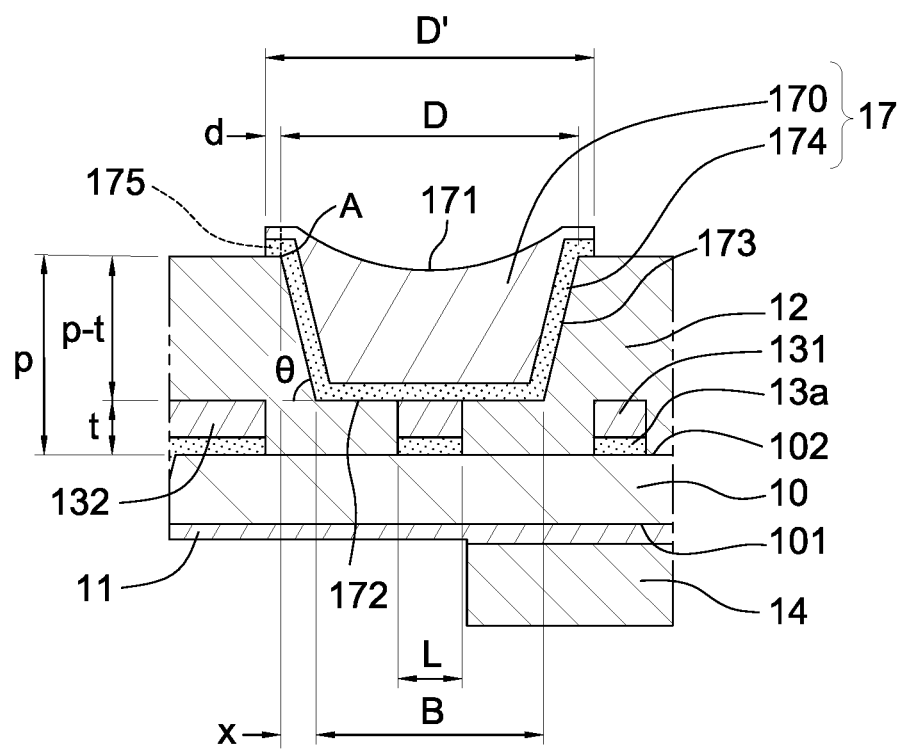
FIG. 1B illustrates a cross-sectional view of an arrangement of an external connection pad according to some embodiments of the present disclosure.

The second patterned conductive layer 13 is disposed adjacent to the surface 102 of the first dielectric layer 11. The second patterned conductive layer 13 is electrically connected to the first patterned conductive layer 11 via an interconnection via. The second patterned conductive layer 13 comprises a pad 131 and a trace 132 adjacent to the pad 131. In some embodiments, the pad 131 and the trace 132 may include a seed layer 13a. The seed layer 13a may include titanium (Ti), a titanium-copper alloy (TiCu), another metal, an alloy, or other suitable materials. The second patterned conductive layer 13 has a thickness t (e.g. as shown in FIG. 1B). The pad 131 has a width L (e.g. as shown in FIG. 1B).

The external connection pad 17 is disposed on the pad 131 of the second patterned conductive layer 13.

In one or more embodiments, at least one portion of the trace 132 of the second patterned conductive layer 13 adjacent to the pad 131 is covered in a projective area of the external connection pad 17 (e.g. a projection of the external connection pad 17 in a direction towards the first dielectric layer 10 can overlap the at least one portion of the trace 132). In one or more embodiments, at least one portion of another pad 131 adjacent to the pad 131 under the external connection pad 17 is covered in a projective area of the external connection pad 17 (e.g. a projection of the external connection pad 17 in a direction towards the first dielectric layer 10 can overlap the at least one portion of the another pad 131). Under this arrangement, a surface density of conductive components including the pad 131 and the trace 132 of the second patterned conductive layer 13 can be increased. The surface area of the first dielectric layer 10 can thus be efficiently used. In some embodiments, an edge of the trace 132 is adjacent to or in contact with an edge of the projective area of the external connection pad 17 (e.g. the protrusion edge 175 is substantially coplanar with the edge of the trace 132).

FIG. 1B is a cross-sectional view of the external connection pad 17 according to some embodiments of the present disclosure. The second dielectric layer 12 is disposed on the surface 102 of the first dielectric layer 10. The second dielectric layer 12 covers the second patterned conductive layer 13 and at least part of a side wall 173 of the external connection pad 17. A protrusion edge 175 of the external connection pad 17 (an edge of a protruding portion of the external connection pad 17, e.g. a portion that protrudes along the second dielectric layer 12) is on a top surface of the second dielectric layer 12. A bottom of the protrusion edge 175 of the external connection pad 17 is directly on the top surface of the second dielectric layer 12. The second dielectric layer 12 has a thickness p. In some embodiments, the second dielectric layer 12 may include an organic layer, such as a solder mask, a PI, an epoxy, an ABF, a PP, a molding compound, or a dry film. The second dielectric layer 12 may include an inorganic layer, such as Si, a glass, or a ceramic.

The external connection pad 17 has a top surface 171, a bottom surface 172, and the side wall 173 (e.g. extending between the top surface 171 and the bottom surface 172). The side wall 173 and the top surface of the second dielectric layer 12 define a joint A. In some embodiments, the top surface 171 of the external connection pad 17 may have a convex shape or a concave shape, or a substantially planar shape. The external connection pad 17 narrows, or tapers from the top surface 171 to the bottom surface 172. In some embodiments, the external connection pad 17 includes a conductive body 170 and a seed layer 174. The conductive body 170 may include copper (Cu), silver (Ag), gold (Au), another metal, an alloy, or other suitable materials. The seed layer 174 may include Ti, TiCu, another metal, an alloy, or other suitable materials. The external connection pad 17 has a protrusion edge 175. The protrusion edge 175 includes a protrusion edge of the conductive body 170 and a protrusion edge of the seed layer 174.

At least one of the pads 131 of the second patterned conductive layer 13 (e.g. the pad on which the external connection pad 17 is disposed) has a thickness t. The pad 131 of the second patterned conductive layer 13 has a width L. In some embodiments, the thickness t of the second patterned conductive layer 13 is ranged from approximately 2 μm to approximately 3 μm. The width L of the pad 131 is ranged from approximately 2 μm to approximately 5 μm. The external connection pad 17 has a bottom width B. The external connection pad 17 has a top width D (e.g. a width defined by a top of a recess in the second dielectric layer in which the external connection pad 17 is disposed). The external connection pad 17 has a top edge width D' (e.g. as measured from edge to edge, such as from a first protrusion edge 175 to a second protrusion edge 175 disposed opposite to the first protrusion edge 175). The protrusion edge 175 has a width d. The top edge width D' of the external connection pad 17 is approximately equal to the top width D of the external connection pad 17 plus two widths d (that is, is approximately equal to 2 times d). The second dielectric layer 12 has a thickness p. In some embodiments, the thickness p of the second dielectric layer 12 is ranged from approximately 3 μm to approximately 12 μm.

In some embodiments, an angle θ between an imaginary line extended from the side wall 173 of the external connection pad 17 and an imaginary line extended from the bottom surface 172 of the external connection pad 17 is selected in accordance with the following equation:

$$\theta = \tan^{-1}\left(\frac{p-t}{x}\right)$$

where p is a thickness of the second dielectric layer 12, t is a thickness of the second patterned conductive layer 13, and x is a distance between an edge of the bottom surface 172 of the external connection pad 17 (e.g. an edge closest to the joint A) and a vertical imaginary line extended from the joint A. The parameter x is a horizontal distance between the edge of the bottom surface 172 of the external connection pad 17 and the vertical imaginary line extended from the joint A. The parameter x is a minimum distance between the edge of the bottom surface 172 of the external connection pad 17 and the vertical imaginary line extended from the joint A.

In some embodiments, the bottom width B of the external connection pad 17 is ranged from approximately 4 μm to approximately 15 μm. The top width D of the external connection pad 17 is ranged from approximately 6 μm to approximately 17.5 μm. The top width D' of the external connection pad 17 is ranged from approximately 8 μm to approximately 19.5 μm. The width d of the protrusion edge 175 is ranged from approximately 0.8 μm to approximately 1.2 μm. The horizontal distance x is ranged from approximately 1.1 μm to approximately 4.7 μm. The thickness t of the second patterned conductive layer 13 is ranged from approximately 2 μm to approximately 3 μm. The thickness p of the second dielectric layer 12 is ranged from approximately 3 μm to approximately 12 μm. In some embodiments, the parameters of the thickness p, the thickness t and the horizontal distance x may be specifically selected such that the angle θ and the parameters satisfy design specifications of a semiconductor device package.

Figure 1C:
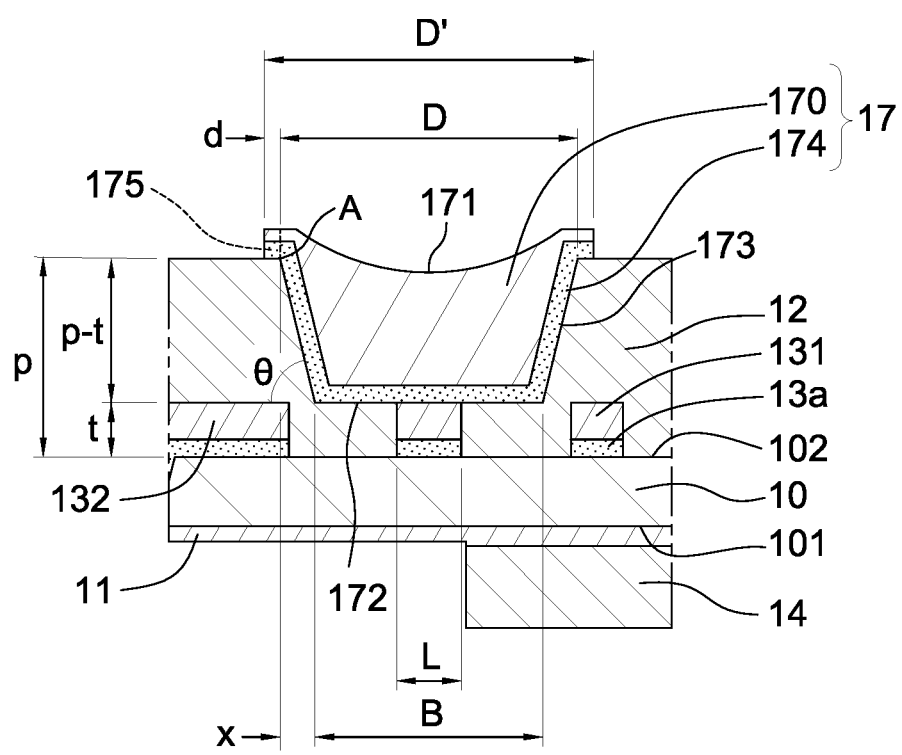
FIG. 1C illustrates a cross-sectional view of an arrangement of an external connection pad according to some embodiments of the present disclosure.

FIG. 1C is a cross-sectional view of the external connection pad 17 according to some embodiments of the present disclosure. The structure of FIG. 1C is similar to the structure of FIG. 1B, except that a portion of the trace 132 adjacent to the pad 131 is disposed under the external connection pad 17. The structure of FIG. 1C is similar to the structure of FIG. 1B, except that a portion of the trace 132 adjacent to the pad 131 disposed within a projective area of the external connection pad 17. At least one portion of another pad 131 adjacent to the pad 131 under the external connection pad 17 is within a projective area of the external connection pad 17.

Figure 2A:
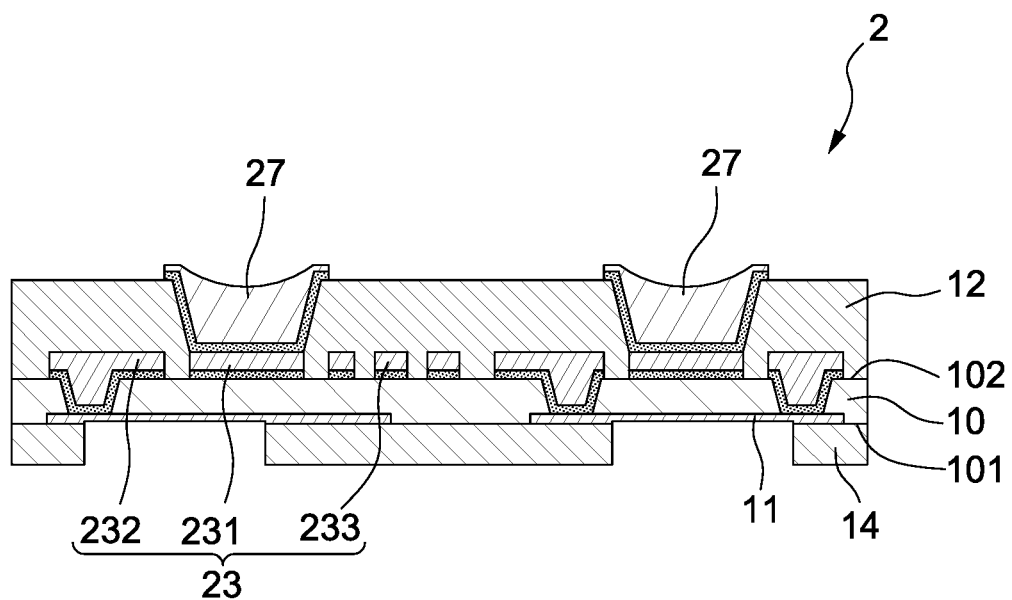
FIG. 2A illustrates a cross-sectional view of a substrate according to some embodiments of the present disclosure.

FIG. 2A is a cross-sectional view of a substrate 2 in accordance with some embodiments of the present disclosure. The substrate 2 includes a first dielectric layer 10, a first patterned conductive layer 11, a second dielectric layer 12, a second patterned conductive layer 23, a passivation layer 14 and an external connection pad 27.

The first dielectric layer 10 has a surface 101 and a surface 102 opposite to the surface 101.

The first patterned conductive layer 11 is disposed adjacent to the surface 101 of the first dielectric layer 10. The first patterned conductive layer 11 is embedded in the surface 101 of the first dielectric layer 10. A bottom surface of the first patterned conductive layer 11 is partially exposed by the passivation layer 14. The bottom surface of the first patterned conductive layer 11 includes a recessed or sunken portion.

The passivation layer 14 is disposed on the surface 101 of the first dielectric layer 10. The passivation layer 14 defines an opening to expose the sunken portion of the first patterned conductive layer 11. A width of the opening may be approximately equal to a width of the sunken portion of the first patterned conductive layer 11.

Figure 2B:
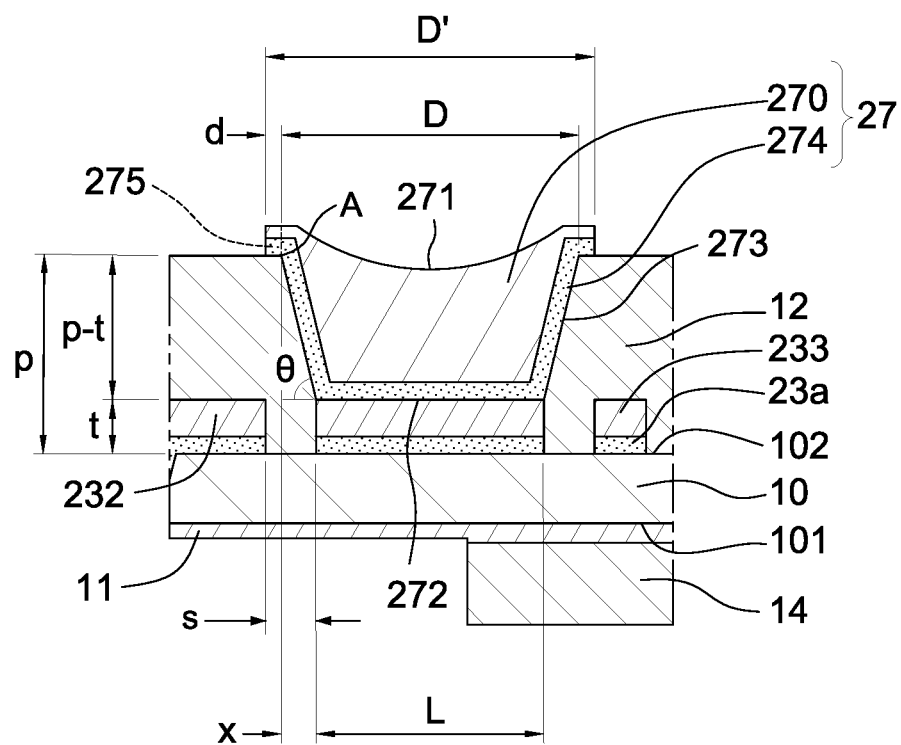
FIG. 2B illustrates a cross-sectional view of an arrangement of an external connection pad according to some embodiments of the present disclosure.

The second patterned conductive layer 23 is disposed adjacent to the surface 102 of the first dielectric layer 11. The second patterned conductive layer 23 is electrically connected to the first patterned conductive layer 11 via an interconnection via. The second patterned conductive layer 23 comprises a first pad 231, a trace 232 and a second pad 233. A width of the first pad 231 is greater than a width of the second pad 233. In some embodiments, the trace 232 is adjacent to the first pad 231. The second pad 233 is adjacent to the first pad 231. In some embodiments, the first pad 231, the trace 232 and the second pad 233 may include a seed layer 23a (e.g. as shown in FIG. 2B). The seed layer 23a may include Ti, TiCu, another metal, an alloy, or other suitable materials. The second patterned conductive layer 23 has a thickness t. The first pad 231 has a width L.

The external connection pad 27 is disposed on the first pad 231 of the second patterned conductive layer 23.

In one or more embodiments, at least one portion of the trace 232 of the second patterned conductive layer 23 adjacent to the first pad 231 is covered in a projective area of the external connection pad 27 (e.g. a projection of the external connection pad 27 in a direction towards the first dielectric layer 10 can overlap the at least one portion of the trace 232). In one or more embodiments, at least one portion of the second pad 233 adjacent to the first pad 231 is covered in the projective area of the external connection pad 27 (e.g. a projection of the external connection pad 27 in a direction towards the first dielectric layer 10 can overlap the at least one portion of the second pad 233). Under this arrangement, a surface density of conductive components including the first pad 231, the trace 232 and the second pad 233 of the second patterned conductive layer 23 can be increased. The surface area of the first dielectric layer 10 can be efficiently used. In some embodiments, an edge of the trace 232 is adjacent to or in contact with an edge of the projective area of the external connection pad 27 (e.g. the protrusion edge 275 is substantially coplanar with the edge of the trace 232).

The second dielectric layer 12 is disposed on the surface 102 of the first dielectric layer 10. The second dielectric layer 12 covers the second patterned conductive layer 23 and at least part of a side wall 273 of the external connection pad 27. A protrusion edge 275 of the external connection pad 27 is on a top surface of the second dielectric layer 12. A bottom of the protrusion edge 275 of the external connection pad 27 is directly on the top surface of the second dielectric layer 12. The second dielectric layer 12 has a thickness p.

FIG. 2B is a cross-sectional view of the arrangement of the external connection pad 27 according to some embodiments of the present disclosure.

The external connection pad 27 has a top surface 271, a bottom surface 272, and the side wall 273 (e.g. extending between the top surface 271 and the bottom surface 272). The side wall 273 and the top surface of the second dielectric layer 12 define a joint A. In some embodiments, the top surface 271 of the external connection pad 27 may have a convex shape or a concave shape. The external connection pad 27 narrows, or tapers, from the top surface 271 to the bottom surface 272. In some embodiments, the external connection pad 27 includes a conductive body 270 and a seed layer 274. The conductive body 270 may include Cu, Ag, Au, another metal, an alloy, or other suitable materials. The seed layer 274 may include Ti, TiCu, another metal, an alloy, or other suitable materials. The external connection pad 27 is located directly on a top surface of the first pad 231 of the second patterned conductive layer 23. The external connection pad 27 has a protrusion edge 275. The protrusion edge 275 includes a protrusion edge of the conductive body 270 and a protrusion edge of the seed layer 274.

The pad 231 of the second patterned conductive layer 23 has a thickness t. The first pad 231 of the second patterned conductive layer 23 has a width L. In some embodiments, the thickness t of the second patterned conductive layer 23 is ranged from approximately 2 µm to approximately 3 µm. The width L of the first pad 231 is ranged from approximately 4 µm to approximately 15 µm. A width of the second pad 233 is ranged from approximately 2 µm to approximately 5 µm. The protrusion edge 275 has a width d. The external connection pad 27 has a bottom width B. The external connection pad 27 has a top width D. The external connection pad 27 has a top edge width D'. The top edge width D' of the external connection pad 27 is approximately equal to the top width D of the external connection pad 27 plus two widths d. The bottom width B of the external connection pad 27 is greater than or approximately equal to the width L of the first pad 231. In some embodiments, the thickness p of the second dielectric layer 12 is ranged from approximately 3 µm to approximately 15 µm. The pad 231 is separated from the trace 232 by a distance s.

In some embodiments, an angle θ between the side wall 273 of the external connection pad 27 and an imaginary line extended from the bottom surface 272 of the external connection pad 27 is defined in accordance with the following equation:

$$\theta = \tan^{-1}\left(\frac{p-t}{x}\right)$$

where p is a thickness of the second dielectric layer 12, t is a thickness of the second patterned conductive layer 23, and x is a distance between an edge of the bottom surface 272 of the external connection pad 27 and a vertical imaginary line extended from the joint A. The parameter x is a horizontal distance between the edge of the bottom surface 272 of the external connection pad 27 and the vertical imaginary line extended from the joint A. The parameter x is a minimum distance between the edge of the bottom surface 272 of the external connection pad 27 and the vertical imaginary line extended from the joint A. In some embodiments, the value of the parameter x may be approximately equal to the value of the parameter s. In some embodiments, the parameters of the thickness p, the thickness t and the distance x may be specifically selected such that the angle θ and the parameters satisfy design specifications for a semiconductor device package.

In some embodiments, the value of parameter x plus the value of parameter d may be approximately equal to or greater than the value of the parameter s. The angle θ is selected in accordance with the following equation:

$$\theta \leq \tan^{-1}\left(\frac{p-t}{s-d}\right)$$

FIG. 2C is an angle table of the angle θ for the substrate 2 corresponding to some embodiments of the present disclosure. In some embodiments, the angle θ is less than or approximately equal to 80.6 degrees, where about 3 µm≤p≤about 8 µm, about 2 µm≤t≤about 3 µm, and about 1 µm≤x≤about 2 µm. In some embodiments, the angle θ is less than or approximately equal to 71.6 degrees, where about 3 µm≤p≤about 5 µm, about 2 µm≤t≤about 3 µm, and about 1 µm≤x≤about 2 µm. In some embodiments, the angle θ is less than or approximately equal to 45 degrees, where about 3 µm≤p≤about 5 µm, about 2 µm≤t≤about 3 µm, and about 1 µm≤x≤about 2 µm. In some embodiments, the angle θ is less than or approximately equal to 26.6 degrees, where p=about 3 µm, t=about 2 µm, and x=about 2 µm.

Figure 3A:
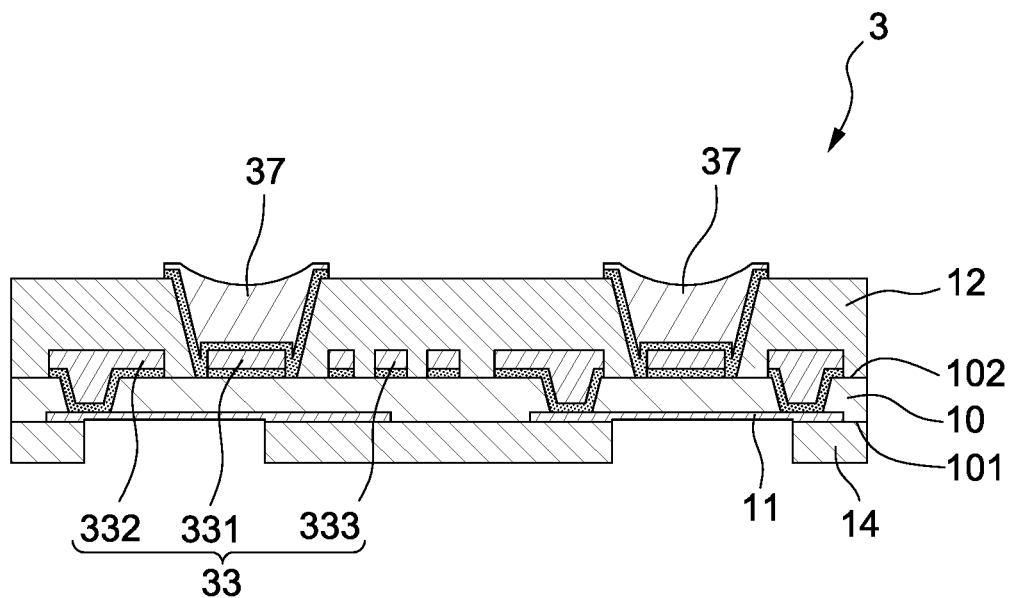
FIG. 3A illustrates a cross-sectional view of a substrate according to some embodiments of the present disclosure.

FIG. 3A is a cross-sectional view of a substrate 3 in accordance with some embodiments of the present disclosure. The substrate 3 includes a first dielectric layer 10, a first patterned conductive layer 11, a second dielectric layer 12, a second patterned conductive layer 33, a passivation layer 14 and an external connection pad 37.

The first dielectric layer 10 has a surface 101 and a surface 102 opposite to the surface 101.

The first patterned conductive layer 11 is disposed adjacent to the surface 101 of the first dielectric layer 10. The first patterned conductive layer 11 is embedded in the surface 101 of the first dielectric layer 10. A bottom surface of the first patterned conductive layer 11 is partially exposed by the passivation layer 14. The bottom surface of the first patterned conductive layer 11 includes a recessed or sunken portion.

The passivation layer 14 is disposed on the surface 101 of the first dielectric layer 10. The passivation layer 14 defines an opening to expose the sunken portion of the first patterned conductive layer 11. A width of the opening may be approximately equal to a width of the sunken portion of the first patterned conductive layer 11.

Figure 3B:
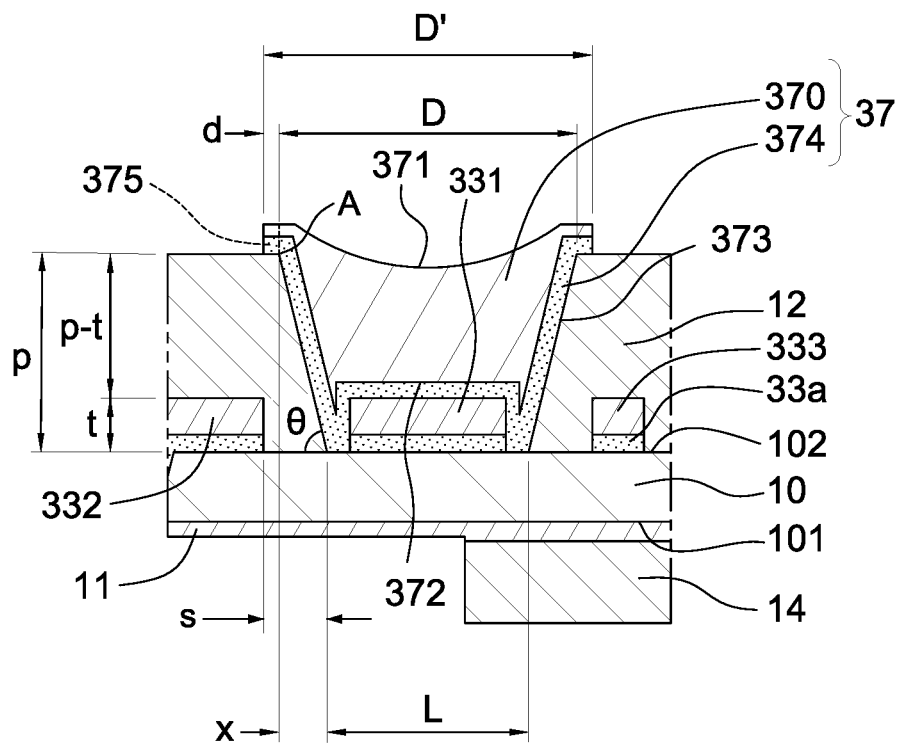
FIG. 3B illustrates a cross-sectional view of an arrangement of an external connection pad according to some embodiments of the present disclosure.

The second patterned conductive layer 33 is disposed adjacent to the surface 102 of the first dielectric layer 11. The second patterned conductive layer 33 is electrically connected to the first patterned conductive layer 11 via an interconnection via. The second patterned conductive layer 33 comprises a first pad 331, a trace 332 and a second pad 333. A width of the first pad 331 is greater than a width of the second pad 333. In some embodiments, the trace 332 is adjacent to the first pad 331. The second pad 333 is adjacent to the first pad 331. In some embodiments, the first pad 331, the trace 332 and the second pad 333 may include a seed layer 33a (e.g. as shown in FIG. 3B). The seed layer 33a may include Ti, TiCu, another metal, an alloy, or other suitable materials. The second patterned conductive layer 33 has a thickness t. The first pad 331 has a width L.

The external connection pad 37 covers a top surface and a side wall of the first pad 331 of the second patterned conductive layer 33. The external connection pad 37 covers (e.g. completely covers) the first pad 331 of the second patterned conductive layer 33.

In one or more embodiments, at least one portion of the trace 332 of the second patterned conductive layer 33 adjacent to the first pad 331 is covered in the projective area of the external connection pad 37 (e.g. a projection of the external connection pad 37 in a direction towards the first dielectric layer 10 can overlap the at least one portion of the first pad 331). In one or more embodiment, at least one portion of the second pad 333 adjacent to the first pad 331 is covered in the projective area of the external connection pad 37 (e.g. a projection of the external connection pad 17 in a direction towards the first dielectric layer 10 can overlap the at least one portion of the second pad 333). Under this arrangement, a surface density of conductive components including the first pad 331, the trace 332 and the second pad 333 of the second patterned conductive layer 33 can be increased. The surface area of the first dielectric layer 10 can be efficiently used. In some embodiments, an edge of the trace 332 is adjacent to or contacts an edge of the projective area of the external connection pad 37 (e.g. the protrusion edge 375 is substantially coplanar with the edge of the trace 332).

The second dielectric layer 12 is disposed on the surface 102 of the first dielectric layer 10. The second dielectric layer 12 covers the second patterned conductive layer 33 and at least part of a side wall 373 of the external connection pad 37. The protrusion edge 375 of the external connection pad 37 is on the top surface of the second dielectric layer 12. The bottom of the protrusion edge 375 of the external connection pad 37 is directly on the top surface of the second dielectric layer 12. The second dielectric layer 12 has a thickness p.

FIG. 3B is a cross-sectional view of the arrangement of the external connection pad 37 according to some embodiments of the present disclosure.

The external connection pad 37 has a top surface 371, a bottom surface 372, and the side wall 373 (e.g. extending between the top surface 371 and the surface 102). The side wall 373 and the top surface of the second dielectric layer 12 define a joint A. In some embodiments, the top surface 371 of the external connection pad 37 may have a convex shape or a concave shape. The external connection pad 37 narrows, or tapers from the top surface 371 to the bottom surface 372. In some embodiments, the external connection pad 37 includes a conductive body 370 and a seed layer 374. The conductive body 370 may include Cu, Ag, Au, another metal, an alloy, or other suitable materials. The seed layer 374 covers the pad 331. The seed layer 374 may include Ti, TiCu, another metal, an alloy, or other suitable materials. The external connection pad 37 has a protrusion edge 375. The protrusion edge 375 includes a protrusion edge of the conductive body 370 and a protrusion edge of the seed layer 374.

The pad 331 of the second patterned conductive layer 33 has a thickness t. The first pad 331 of the second patterned conductive layer 33 has a width L. In some embodiments, the thickness t of the second patterned conductive layer 33 is ranged from approximately 2 µm to approximately 3 µm. The width L of the first pad 331 is ranged from approximately 4 µm to approximately 15 µm. A width of the second pad 333 is ranged from approximately 2 µm to approximately 5 µm. The protrusion edge 375 has a width d. The external connection pad 37 has a bottom width B. The external connection pad 37 has a top width D. The external connection pad 37 has a top edge width D'. The top edge width D' of the external connection pad 37 is approximately equal to the top width D of the external connection pad 37 plus two widths d. The bottom width B of the external connection pad 37 is approximately equal to the width L of the first pad 331. In some embodiments, the thickness p of the second dielectric layer 12 is ranged from approximately 3 µm to approximately 15 µm. The pad 331 is spaced from the trace 332 by a distance s.

In some embodiments, an angle θ between the side wall 373 of the external connection pad 37 and an imaginary line extended from the bottom surface 372 of the external connection pad 37 is defined in accordance with the following equation:

$$\theta = \tan^{-1}\left(\frac{p}{x}\right)$$

where p is a thickness of the second dielectric layer 12, t is a thickness of the second patterned conductive layer 33, and x is a distance between an edge of the bottom surface 372 of the external connection pad 37 and a vertical imaginary line extended from the joint A. The parameter x is a horizontal distance between the edge of the bottom surface 372 of the external connection pad 37 and the vertical imaginary line extended from the joint A. The parameter x is a minimum distance between the edge of the bottom surface 372 of the external connection pad 37 and the vertical imaginary line extended from the joint A. In some embodiments, the distance x is the distance between the first pad 331 and the trace 332. In some embodiments, the value of the parameter x may be approximately equal to the value of the parameter s. In some embodiments, the parameters of the thickness p, the thickness t and the distance x may be selected such that the angle θ and the parameters satisfy specifications for a semiconductor device package.

In some embodiments, the value of the parameter x plus the value of the parameter d may be approximately equal to or greater than the value of the parameter s. The side wall 373 of the external connection pad 37 does not contact the adjacent trace 332 or the adjacent pad 333. The angle θ is determined by the following equation:

$$\tan^{-1}\left(\frac{t}{s}\right) < \theta \leq \tan^{-1}\left(\frac{p}{s-d}\right)$$

FIG. 3C is an angle table of the angle θ for the substrate 3 corresponding to some embodiments of the present disclosure. The angle table shows the conditions under which the side wall 373 of the external connection pad 73 would not contact the trace 332 or the second pad 333 of the second patterned conductive layer 33. In some embodiments, the range of the angle θ is about 45 degrees<θ≤about 71.6 degrees, about 2 μm≤t≤about 3 μm, and about 1 μm≤x≤about 2 μm.

FIG. 3D is an angle table of the angle θ for the substrate 3 corresponding to some embodiments of the present disclosure. The angle table shows conditions under which at least one portion of the trace 332 of the second patterned conductive layer 33 is covered in the projective area of the external connection pad 73 or at least one portion of the second pad 333 of the second patterned conductive layer 33 is covered in the projective area of the external connection pad 73. In some embodiments, the range of the angle θ is about 45 degrees<θ≤about 71.6 degrees, p=about 3 μm, about 2 μm≤t≤about 3 μm, and about 1 μm≤x≤about 2 μm. In some embodiments, the range of the angle θ is 45 degrees<θ≤about 56.3 degrees, p=about 3 μm, 2 μm≤t≤about 3 μm, and x=about 2 μm. In some embodiments, the range of the angle θ is about 63.5 degrees<θ≤about 71.6 degrees, p=about 3 μm, about 2 μm≤t≤about 3 μm, and x=about 1 μm.

Figure 4A:
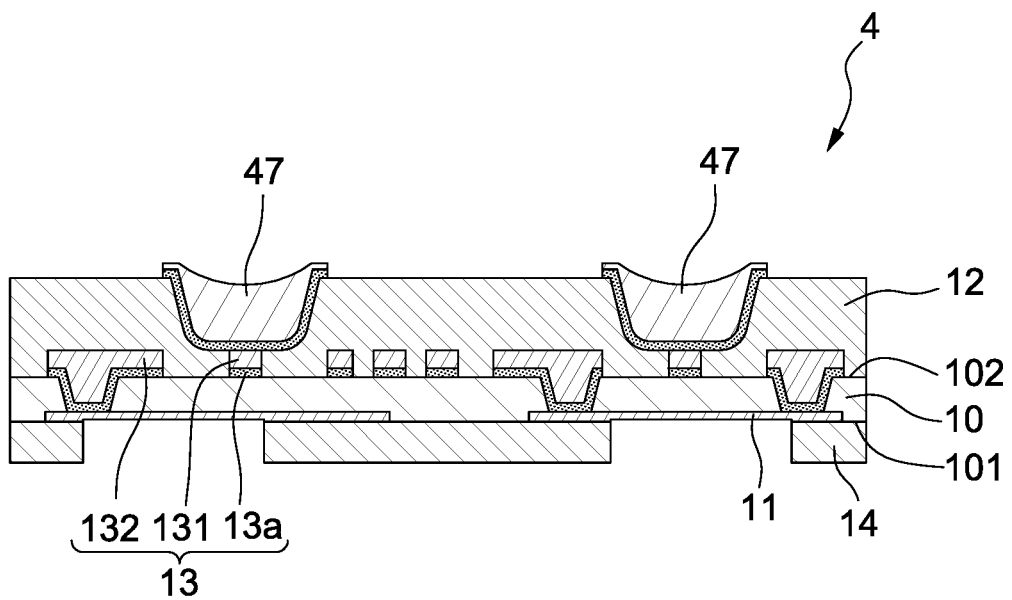
FIG. 4A illustrates a cross-sectional view of a substrate according to some embodiments of the present disclosure.

FIG. 4A is a cross-sectional view of a substrate 4 in accordance with some embodiments of the present disclosure. The substrate 1 includes a first dielectric layer 10, a first patterned conductive layer 11, a second dielectric layer 12, a second patterned conductive layer 13, a passivation layer 14 and an external connection pad 47. The external connection pad 47 has a top surface 471, a bottom surface 472, and a side wall 473. The external connection pad 47 includes a conductive body 470 and a seed layer 474.

The depicted structure of FIG. 4 is similar to the structure depicted in FIG. 1, except that the side wall 473 of the external connection pad 47 defines one or more curved corners with the bottom surface 472.

Figure 4B:
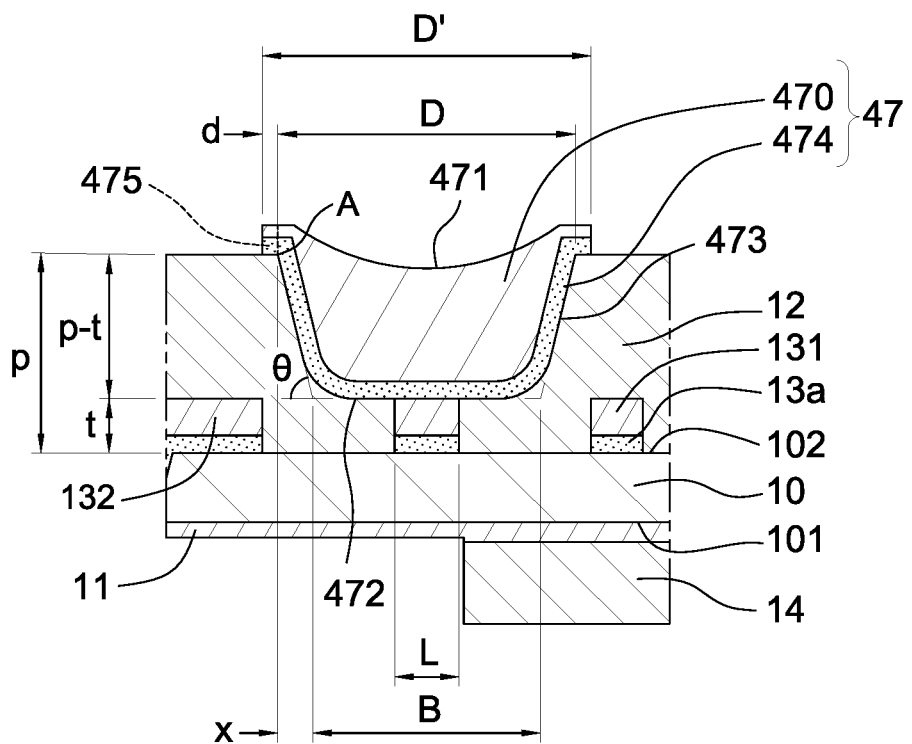
FIG. 4B illustrates a cross-sectional view of an arrangement of an external connection pad according to some embodiments of the present disclosure.

FIG. 4B is a cross-sectional view of the arrangement of the external connection pad 47 according to some embodiments of the present disclosure. The definitions of the parameters are similar to those of FIG. 1B. The parameter values implemented in the embodiments shown in FIG. 4B may be any suitable parameter values described herein, or may be adjusted to account for the curved corners.

Figure 5:
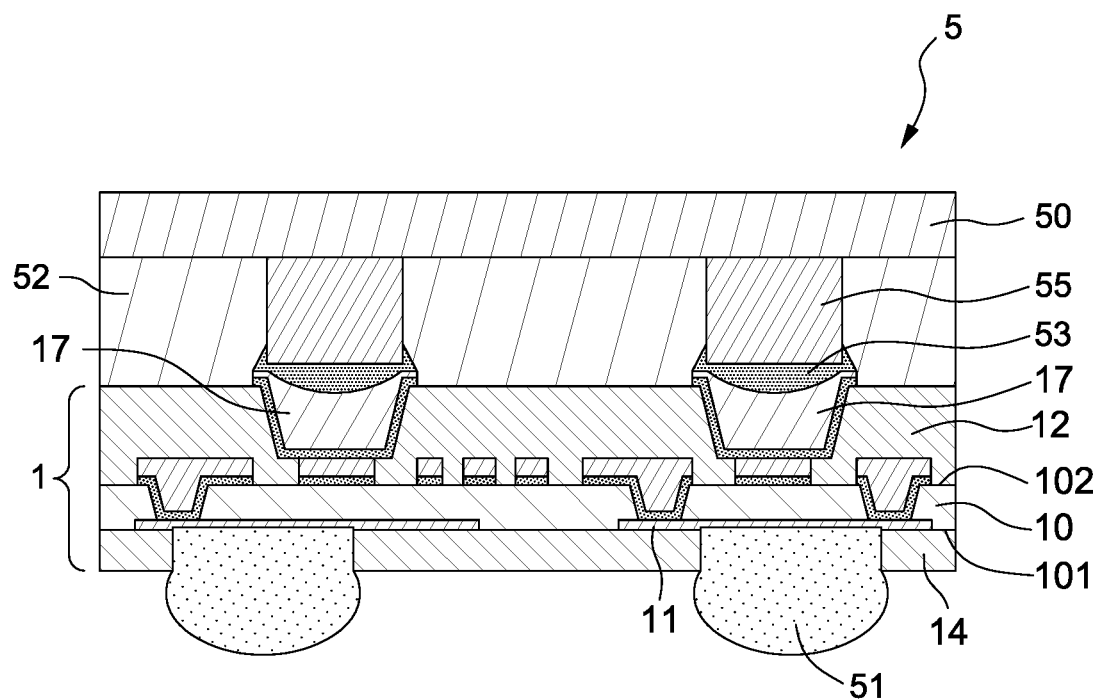
FIG. 5 illustrates a cross-sectional view of a semiconductor device package according to some embodiments of the present disclosure.

FIG. 5 is a cross-sectional view of a semiconductor device package 5 according to some embodiments of the present disclosure. The semiconductor device package 5 includes at least some components similar to those described above with respect to FIG. 1A, and a substrate 1, a solder 53, a conductive pillar 55, a semiconductor device 50, an underfill 52, and a connection element 51.

The connection element 51 is disposed adjacent to the surface 101 of the first dielectric layer 10. The connection element 51 is disposed at the sunken portion of the first patterned conductive layer 11. The connection element 51 is electrically connected to the first patterned conductive layer 11. The connection element 51 has a first portion disposed in the passivation layer 14 and a second portion exposed from the passivation layer 14.

The semiconductor device 50 is disposed on the substrate 1. The underfill 52 is disposed between the substrate 1 and the semiconductor device 50. The semiconductor device 50 is electrically connected to the external connection pad 17 of the substrate 1 through an interconnect element (e.g. through one of, or both of, the solder 53 and the conductive pillar 55). The top surface 171 of the external connection pad 17 has a concave shape. The area of the top surface 171 of the external connection pad 17 is large enough to readily attach the semiconductor device 50 to the substrate 1, and the resistance of the external connection pad 17 may be set to be within design specifications.

Since the top surface 171 of the external connection pad 17 has a concave shape, the top area of the top surface 171 of the external connection pad 17 is increased and the contact area of the top surface 171 of the external connection pad 17 configured to receive the solder 53 is increased.

Figure 6:
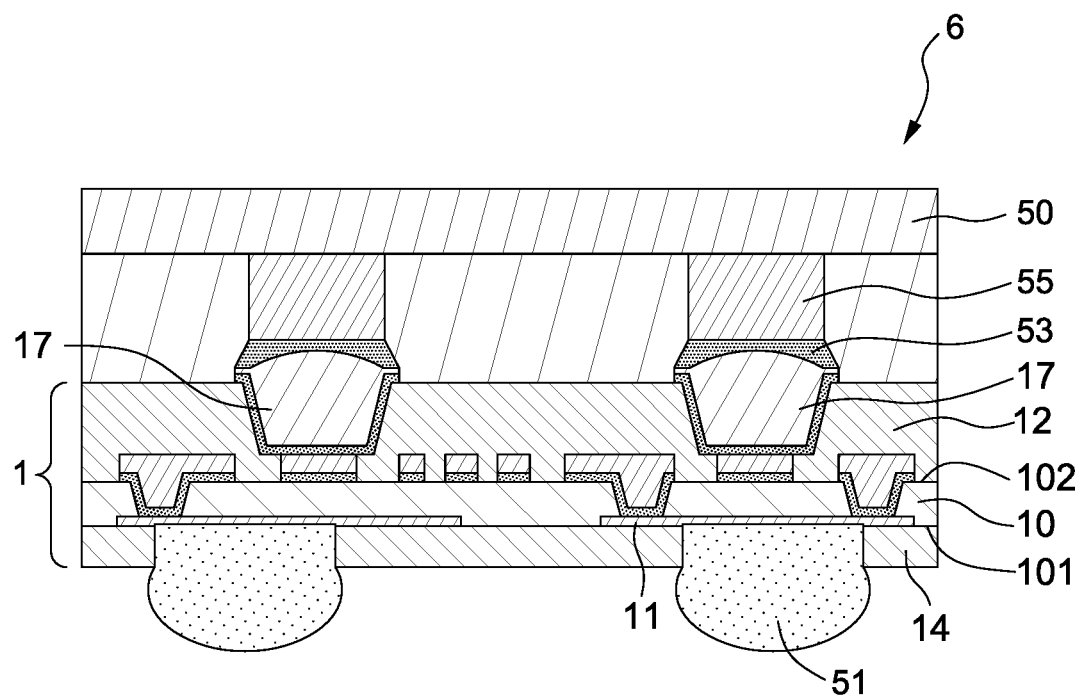
FIG. 6 illustrates a cross-sectional view of a semiconductor device package according to some embodiments of the present disclosure.

FIG. 6 is a cross-sectional view of a semiconductor device package 6 according to some embodiments of the present disclosure. The depicted structure of FIG. 6 is similar to the structure depicted in FIG. 5, except that the top surface 171 of the external connection pad 17 has a convex shape. Such a top surface can provide advantages similar to those described above with respect to the concave surface.

Figure 7A:
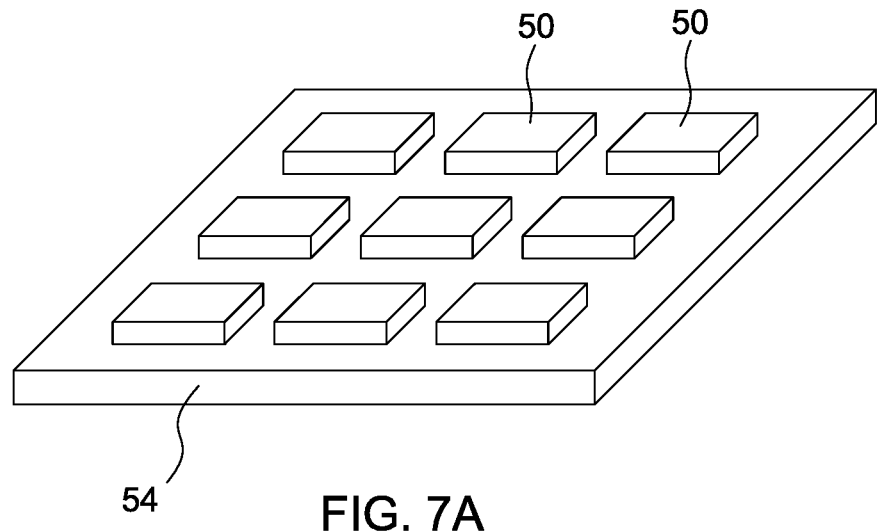
FIG. 7A illustrates a type of a carrier for semiconductor package devices in accordance with some embodiments of the present disclosure.

FIG. 7A shows a type of a carrier for semiconductor package devices in accordance with some embodiments of the present disclosure.

As shown in FIG. 7A, a plurality of semiconductor devices 50 or dies are placed on a substantially square-shaped carrier 54 (e.g. in accordance with one or more embodiments described herein). In some embodiments, the carrier 54 may include organic materials (e.g., a molding compound, bismaleimide triazine (BT), a PI, a polybenzoxazole (PBO), a solder resist, an ABF, a PP or an epoxy-based material) and/or inorganic materials (e.g., silicon, a glass, a ceramic or quartz).

Figure 7B:
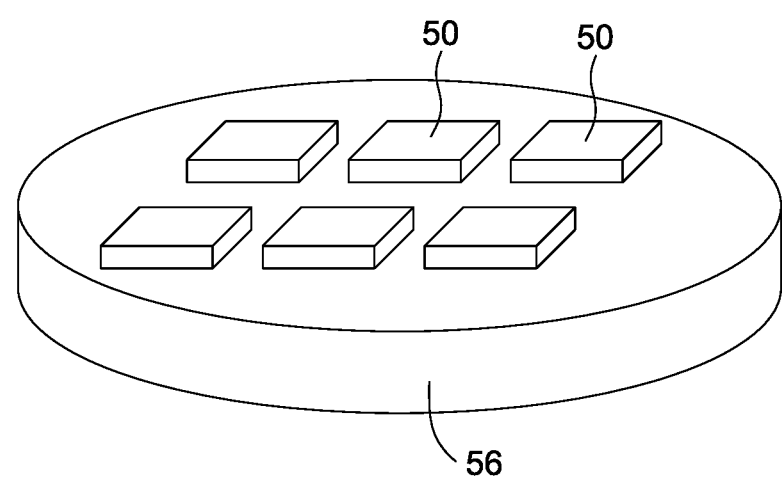
FIG. 7B illustrates a type of a carrier for semiconductor package devices in accordance with some embodiments of the present disclosure.

FIG. 7B shows an another type of a carrier for semiconductor package devices in accordance with some embodiments of the present disclosure.

As shown in FIG. 7B, a plurality of semiconductor devices 50 or dies are placed on a substantially circle-shaped carrier 56 (e.g. in accordance with one or more embodiments described herein). In some embodiments, the carrier 56 may include organic materials (e.g., a molding compound, BT, a PI, a PBO, a solder resist, an ABF, a PP or an epoxy-based material) and/or inorganic materials (e.g., silicon, a glass, a ceramic or quartz).

FIG. 8A through FIG. 8L illustrate some embodiments of a method of manufacturing the semiconductor device package 1 according to some embodiments of the present disclosure.

Figure 8A:
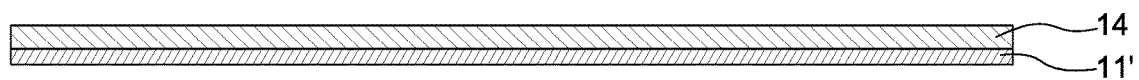
FIG. 8A illustrates a method of manufacturing a semiconductor device package according to some embodiments of the present disclosure.

Referring to FIG. 8A, a method for manufacturing the semiconductor device package 1 includes providing a passivation layer 14 on a conductive layer 11', or forming the conductive layer 11' on the passivation layer 14.

Figure 8B:
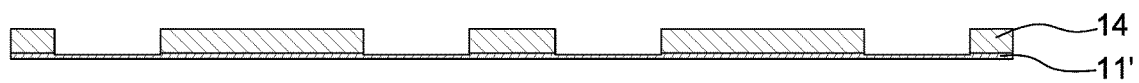
FIG. 8B illustrates a method of manufacturing a semiconductor device package according to some embodiments of the present disclosure.

Referring to FIG. 8B, the conductive layer 11' is thinned by an etching operation. Then, the passivation layer 14 is patterned to form an opening to expose a portion of the conductive layer 11'. The exposed portion of the conductive layer 11' is etched to form a recessed or sunken portion. The depth of the gap at the sunken portion may be set by controlling the etching operation.

Figure 8C:
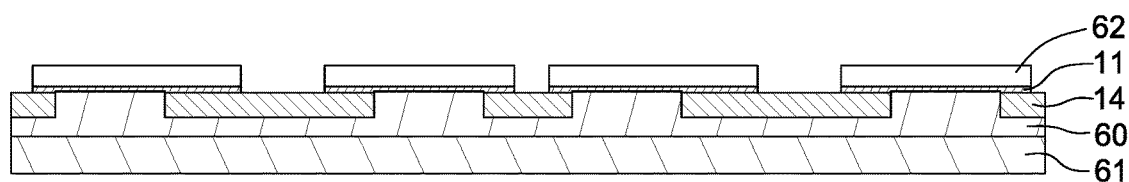
FIG. 8C illustrates a method of manufacturing a semiconductor device package according to some embodiments of the present disclosure.

Referring to FIG. 8C, a carrier 61 is bonded on the passivation layer 14 through an adhesion layer 60, or is laminated to the passivation layer 14. Then, a photoresist 62 is formed on the conductive layer 11' and then the conductive layer 11' is backside etched to form the first patterned conductive layer 11. The photoresist 62 may be subsequently removed.

Figure 8D:
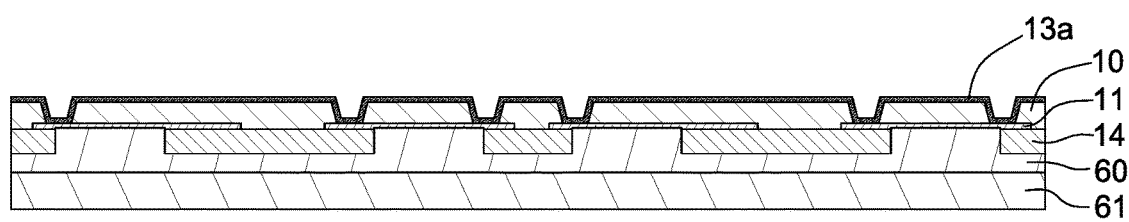
FIG. 8D illustrates a method of manufacturing a semiconductor device package according to some embodiments of the present disclosure.

Referring to FIG. 8D, a first dielectric layer 10 having a bottom surface 101 and a top surface 102 opposite to the first surface is provided on the first patterned conductive layer 11. In some alternative embodiments, the first dielectric layer 10 is provided, and the first dielectric layer 10 if formed on the first dielectric layer 10. An opening is formed in the first dielectric layer 10. A seed layer 13a is formed on the surface 102 of the first dielectric layer 10.

Figure 8E:
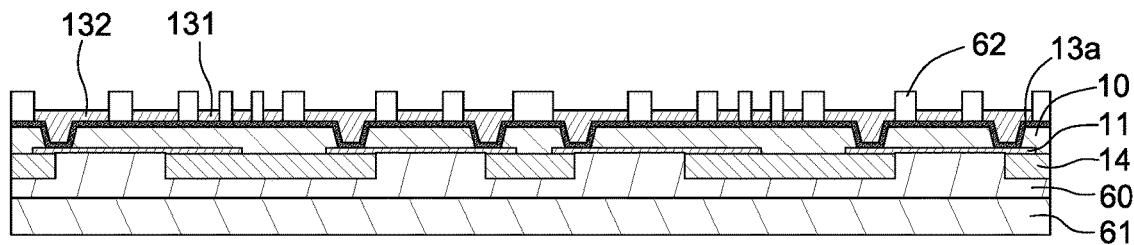
FIG. 8E illustrates a method of manufacturing a semiconductor device package according to some embodiments of the present disclosure.

Referring to FIG. 8E, another photoresist 62 with openings is formed on the seed layer 13a. A conductive layer is formed in the openings of the photoresist 62 by a plating operation to form a second patterned conductive layer 13. In some embodiments, the second patterned conductive layer 13 may include the seed layer 13a. The second patterned conductive layer 13 is formed adjacent to the top surface 102 of the first dielectric layer 10 and electrically connected to the first patterned conductive layer 11. The second patterned conductive layer 13 comprises a pad 131 and a trace 132 adjacent to the pad 131.

Figure 8F:
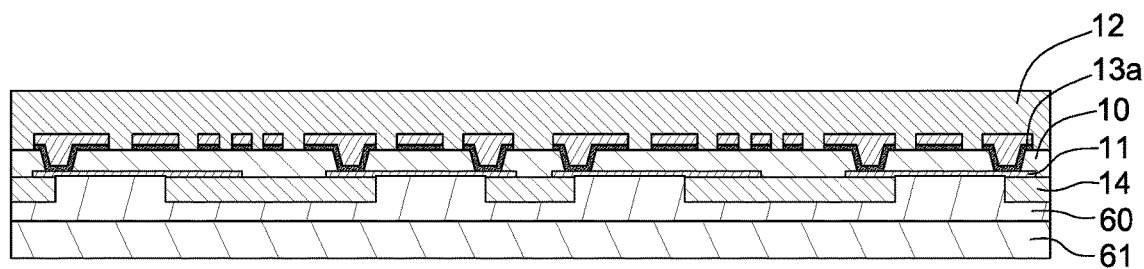
FIG. 8F illustrates a method of manufacturing a semiconductor device package according to some embodiments of the present disclosure.

Referring to FIG. 8F, the photoresist 62 is removed and a portion of the seed layer 13a is removed by an etching operation. Then, the second dielectric layer 12 is disposed on the top surface 102 of the first dielectric layer 10. The second dielectric layer 12 is a development dielectric layer. The second dielectric layer 12 comprises a polymer, a sensitizer, and a solvent. In some embodiments, the sensitizer may comprise 1,2-Octanedione, 1-[4-(phenylthio)phenyl]-,2-(O-benzoyloxime), a photoacid generator, or triarylsulfonium hexafluoroantimonate. A weight percentage of the sensitizer (e.g. a percentage of the second dielectric layer 12, by weight, that is constituted by the sensitizer) may be ranged from approximately 2.5% to approximately 0.1%. A weight percentage of the sensitizer may be about 0.2% or more, such as about 0.25% or more, 0.3% or more, 0.35% or more, or greater.

Figure 8G:
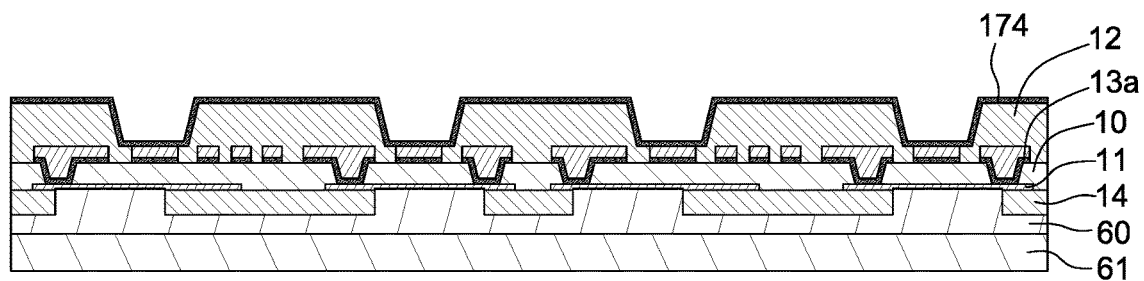
FIG. 8G illustrates a method of manufacturing a semiconductor device package according to some embodiments of the present disclosure.

Referring to FIG. 8G, an opening is formed in the second dielectric layer 12. A seed layer 174 is formed on the second dielectric layer 12. A degree of inclination of a side wall of the opening of the second dielectric layer 12 can be controlled by selecting the weight percentage and/or concentration of the sensitizer in the second dielectric layer 12. The degree of inclination of the side wall of the opening may directly define an angle θ of an external connection pad 17 (e.g. as shown in FIG. 1B). When the degree of inclination of the side wall of the opening increases, the angle θ of the external connection pad 17 decreases. Accordingly, when the weight percentage or concentration of the sensitizer increases, the angle θ of the external connection pad 17 decreases. An increase of the weight percentage of the sensitizer in the second dielectric layer 12 (development dielectric layer) would decrease a width of a bottom surface of the external connection pad 17.

Figure 8H:
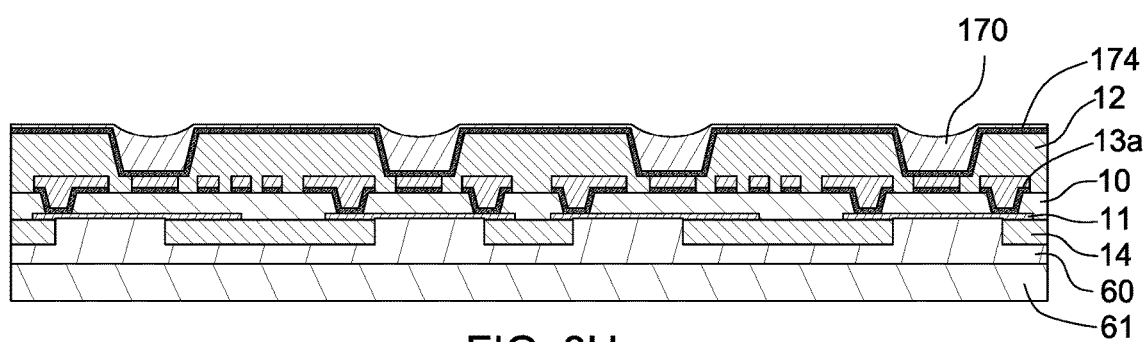
FIG. 8H illustrates a method of manufacturing a semiconductor device package according to some embodiments of the present disclosure.

Referring to FIG. 8H, a conductive layer 170 is formed in the opening of the second dielectric layer 12 by a plating operation.

Figure 8I:
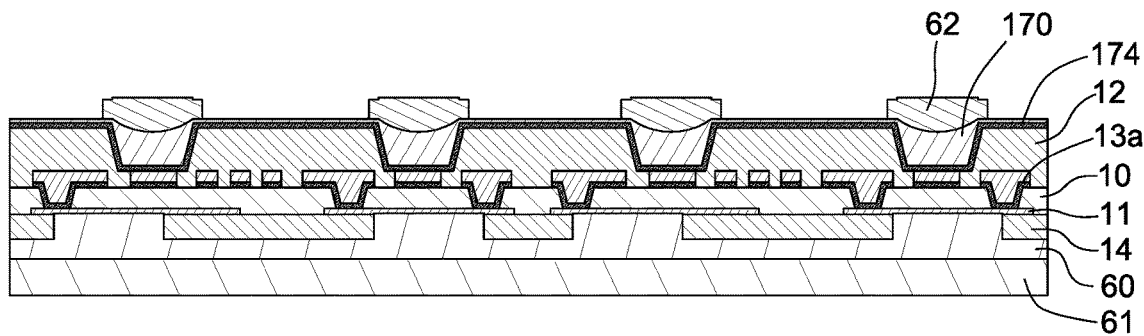
FIG. 8I illustrates a method of manufacturing a semiconductor device package according to some embodiments of the present disclosure.

Referring to FIG. 8I, another photoresist 62 with openings is formed on the conductive layer 170 (e.g. to cover the conductive layer 170).

Figure 8J:
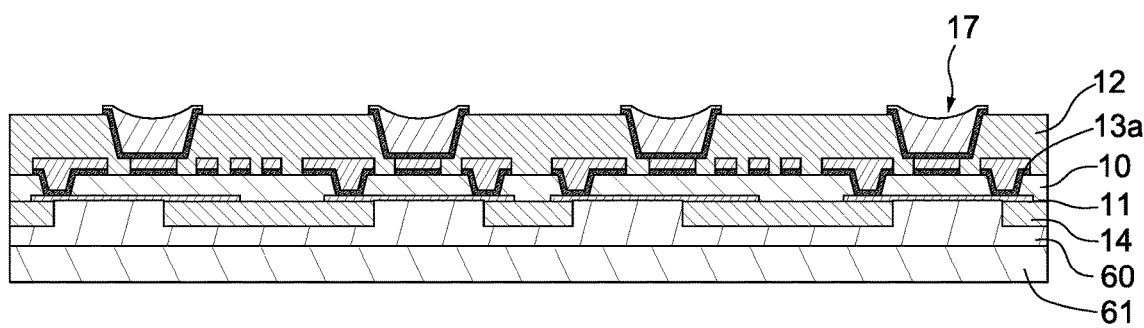
FIG. 8J illustrates a method of manufacturing a semiconductor device package according to some embodiments of the present disclosure.

Referring to FIG. 8J, etching operations are performed to remove a portion of the conductive layer 170 and a portion of the seed layer 174 so as to form the external connection pad 17, thus forming a substrate 1. According to the design of the substrate 1, even if the opening of the second dielectric layer 12 shifts or is not properly aligned during an alignment operation, the external connection pad 17 would not contact an adjacent trace or pad (e.g. because a bottom of the external connection pad 17 is at a higher elevation than the adjacent trace or pad).

Figure 8K:
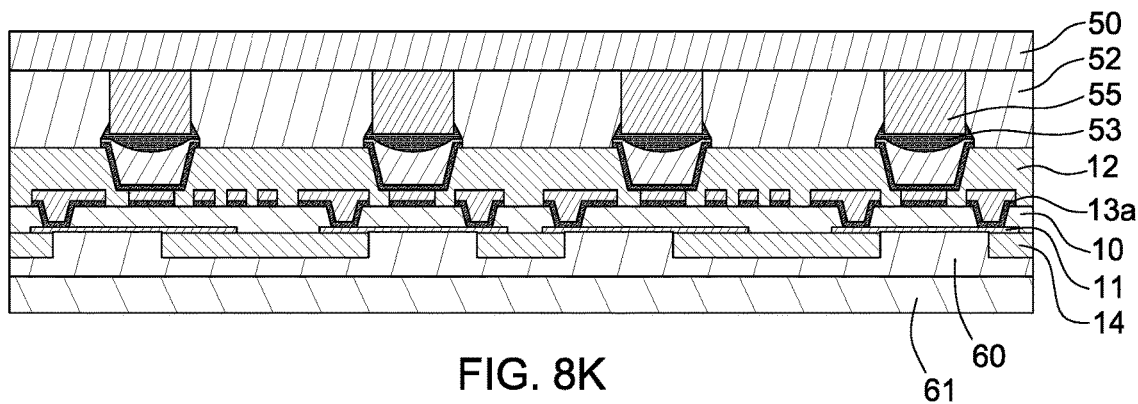
FIG. 8K illustrates a method of manufacturing a semiconductor device package according to some embodiments of the present disclosure.

Referring to FIG. 8K, a semiconductor device 50 is attached to the external connection pad 17 through a solder 53 and a conductive pillar 55. An underfill 52 is filled between the semiconductor device 50 and the second dielectric layer 12.

According to the structure of the substrate 1, the solder 53 is electrically connected to the external connection pad 17. The risk of an undesirable solder bridge of the solder 53 that may occur during a reflow operation can be avoided. Additionally, since the surface density of the pad 131 and trace 132 of the second patterned conductive layer 13 is large, the whole thickness of the substrate 1 can be kept small.

Figure 8L:
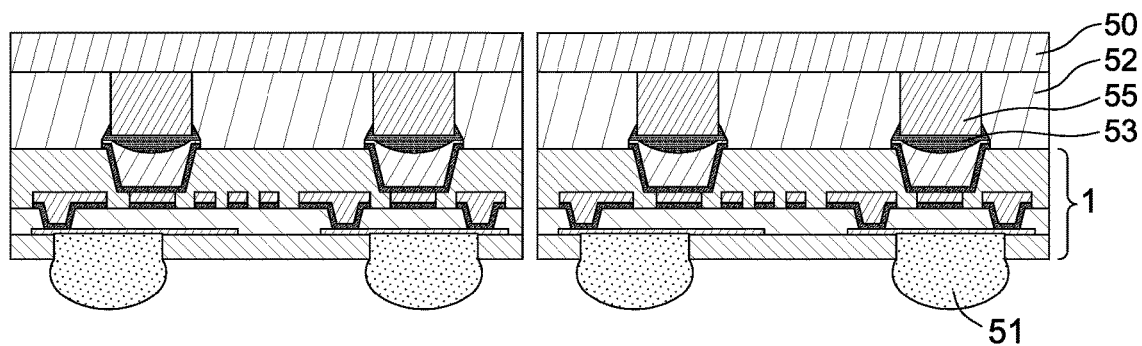
FIG. 8L illustrates a method of manufacturing a semiconductor device package according to some embodiments of the present disclosure.

Referring to FIG. 8L, the carrier 61 and the adhesion layer 60 are removed. The connection element 51 is disposed in the opening of the passivation layer 14. Then, a singulation operation is performed.

The connection element 51 is disposed adjacent to the surface 101 of the first dielectric layer 10. The connection element 51 is disposed on the first patterned conductive layer 11. The connection element 51 has a first portion disposed in the opening of the passivation layer 14 and a second portion exposed from the passivation layer 14. A width of the first portion of the connection element 51 is substantially equal to a width of the opening of the passivation layer 14.

Figure 9:
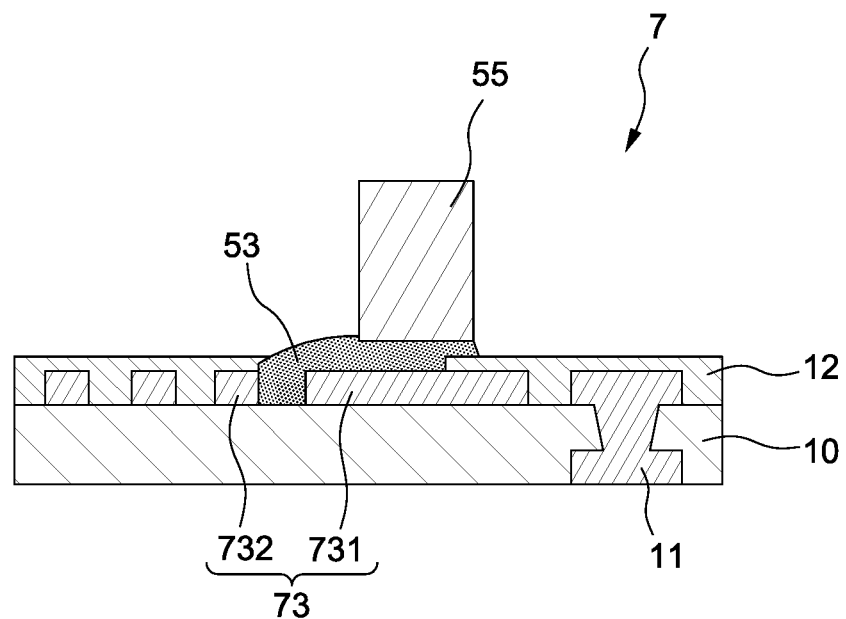
FIG. 9 illustrates a cross-sectional view of a comparative substrate.

FIG. 9 illustrates a cross-sectional view of a comparative substrate 7. The substrate 7 includes a first dielectric layer 10, a first patterned conductive layer 11, a second dielectric layer 12, a patterned conductive layer 73, a solder 53 and a conductive pillar 55. The patterned conductive layer 73 includes a first pad 731 and a second pad 732. A width of the first pad 131 is greater than a width of the second pad 732. The first pad has a large width for contacting the conductive pillar 55. However, since the first pad may occupy a large area of the first dielectric layer 10, a total number of I/O able to be implemented with the substrate 7 may be small.

The second dielectric layer 12 defines an opening. The opening may shift during an alignment operation. According to some design specifications, the second pad 732 should be completely covered by the second dielectric layer 12, but may be exposed from the second dielectric layer 12 due to the shift. The solder 53 bleeds during a reflow operation and contacts the second pad 732. Therefore, an undesirable solder bridge of the solder 53 occurs during the reflow operation.

Figure 10:
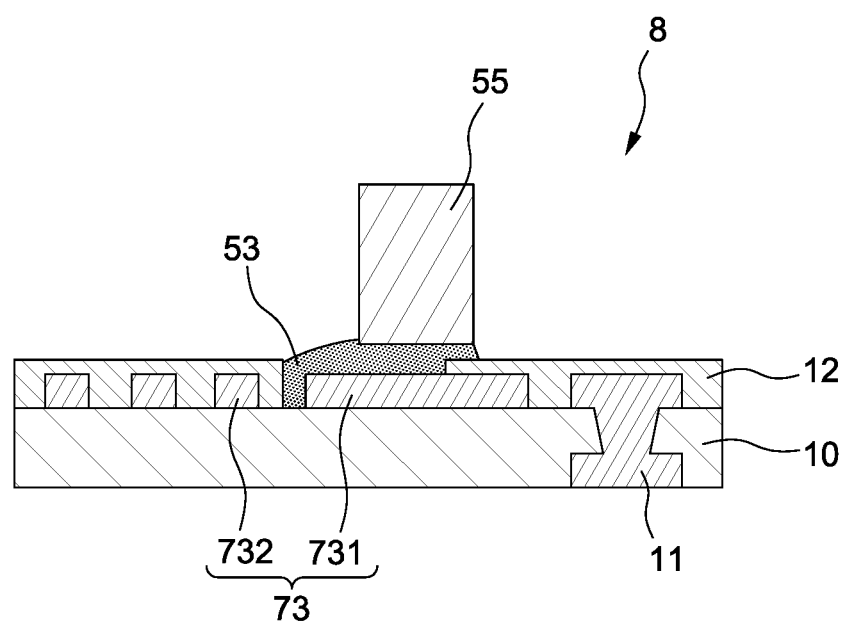
FIG. 10 illustrates a cross-sectional view of a comparative substrate.

FIG. 10 illustrates a cross-sectional view of a comparative substrate 8. The structure depicted in FIG. 10 is similar to the structure depicted in FIG. 9, except that the second pad 732 is not exposed from the second dielectric layer 12.

The opening of the second dielectric layer 12 may shift during an alignment operation. The degree of shift of the opening of the second dielectric layer 12 in FIG. 10 is less than that shown in FIG. 9. However, the solder 53 still bleeds to the first dielectric layer 10 during a reflow operation. A structure of the solder 53 and conductive pillar 55 is not stable. The conductive pillar 55 may collapse when the substrate 8 encounters a press or a force during some operations for manufacturing a semiconductor device package, such as a bonding operation.

Figure 11:
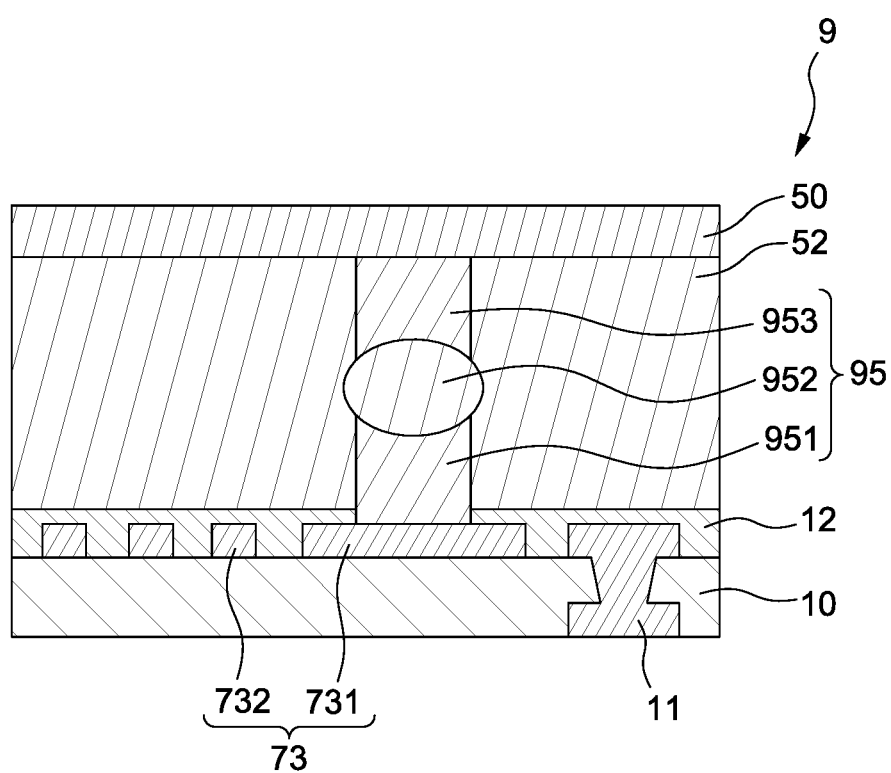
FIG. 11 illustrates a cross-sectional view of a comparative semiconductor device package.

FIG. 11 illustrates a cross-sectional view of a comparative semiconductor device package 9. The semiconductor device package 9 includes a first dielectric layer 10, a first patterned conductive layer 11, a second dielectric layer 12, a patterned conductive layer 73, an underfill 52, an interconnection element 95 and a semiconductor device 50. The interconnection element 95 includes a conductive pillar 951, a conductive pillar 953, and a solder 952. The underfill 52 is disposed between the second dielectric layer 12 and the semiconductor device 50.

In order to increase a contact area between the conductive pillars 951 and 953, the solder 952 can be disposed between the conductive pillars 951 and 953. This kind of structure for the interconnection element 95 can help to avoid the solder bridge issue of the solder 53 depicted in FIG. 9 and the collapse issue of the solder 53 and conductive pillar 55 depicted in FIG. 10. However, the structure of the interconnection element 95 increases the thickness of the semiconductor device package 9.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, a first numerical value can be deemed to be substantially, approximately, or about the same as a second numerical value if the first numerical value is within a range of variation of less than or equal to ±10% of the second numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A substrate, comprising:
a first dielectric layer having a first surface and a second surface opposite to the first surface;
a first patterned conductive layer adjacent to the first surface of the first dielectric layer;
a second patterned conductive layer adjacent to the second surface of the first dielectric layer and electrically connected to the first patterned conductive layer, the second patterned conductive layer comprising a pad and a trace adjacent to the pad; and
an external connection pad tapered from a top surface to a bottom surface, the external connection pad disposed on the pad of the second patterned conductive layer,
wherein a bottom width of the external connection pad is greater than or about equal to a width of the pad of the second patterned conductive layer.

2. The substrate of claim 1, wherein at least one portion of the trace of the second patterned conductive layer is covered by a projection of the external connection pad towards the first dielectric layer.

3. The substrate of claim 1, further comprising a second dielectric layer disposed on the second surface of the first dielectric layer, the second dielectric layer covering the second patterned conductive layer and at least part of a side wall of the external connection pad.

4. The substrate of claim 3, wherein:
a bottom surface of the external connection pad is located on a top surface of the pad of the second patterned conductive layer,
the bottom width of the external connection pad is about equal to the width of the pad of the second patterned conductive layer,
the external connection pad has a protrusion edge on a top surface of the second dielectric layer,
the side wall of the external connection pad and the top surface of the second dielectric layer define a joint, and
an angle θ between the side wall of the external connection pad and an imaginary line extended from the bottom surface of the external connection pad complies with the following equation:

$$\theta \leq \tan^{-1}\left(\frac{p-t}{s-d}\right)$$

where:
p is a thickness of the second dielectric layer,
t is a thickness of the second patterned conductive layer,
s is a distance between the pad and the trace,
d is a width of the protrusion edge, and x is a distance between an edge of the bottom surface of the external connection pad and a vertical imaginary line extended from the joint.

5. The substrate of claim 4, wherein the angle θ is less than or equal to 80.6 degrees.

6. The substrate of claim 5, wherein 3 μm≤p≤8 μm, 2 μm≤t≤3 μm, and 1 μm ≤x≤2 μm.

7. The substrate of claim 4, wherein the angle θ is less than or equal to 71.6 degrees.

8. The substrate of claim 7, wherein 3 μm≤p≤5 μm, 2 μm≤t≤3 μm, and 1 μm≤x≤2 μm.

9. The substrate of claim 4, wherein the angle θ is less than or equal to 45 degrees.

10. The substrate of claim 9, wherein the angle θ is less than or equal to 26.6 degrees, and p=about 3 μm, t=about 2 μm, and x=about 2 μm.

11. The substrate of claim 10, wherein the second dielectric layer comprises a sensitizer, and the sensitizer comprises triarylsulfonium hexafluoroantimonate.

12. The substrate of claim 3, wherein:
the external connection pad covers a top surface and a side wall of the pad of the second patterned conductive layer,
the bottom width of the external connection pad is about equal to the width of the pad of the second patterned conductive layer,
the external connection pad has a protrusion edge on a top surface of the second dielectric layer,
the side wall of the external connection pad and the top surface of the second dielectric layer define a joint, and
an angle θ between the side wall of the external connection pad and an imaginary line extended from the bottom surface of the external connection pad is selected in accordance with the following equation:

$$\tan^{-1}\left(\frac{t}{s}\right) < \theta \le \tan^{-1}\left(\frac{p}{s-d}\right)$$

where:
p is a thickness of the second dielectric layer,
t is a thickness of the second patterned conductive layer,
s is a distance between the pad and the trace,
d is a width of the protrusion edge, and
x is a distance between an end of the bottom surface of the external connection pad and a vertical imaginary line extended from the joint.

13. The substrate of claim 12, wherein 45 degrees<θ≤71.6 degrees, p=about 3 μm, 2 μm≤t≤3 μm, and 1 μm≤x≤2 μm.

14. The substrate of claim 12, wherein 45 degrees<θ≤56.3 degrees, p=about 3 μm, 2 μm≤t≤3 μm, and x=about 2 μm.

15. The substrate of claim 12, wherein 63.5 degrees<θ≤71.6 degrees, p=about 3 μm, 2 μm≤t≤3 μm, and x=about 1 μm.

16. The substrate of claim 1, wherein the first patterned conductive layer is embedded in the first surface of the first dielectric layer.

17. The substrate of claim 16, wherein a bottom surface of the first patterned conductive layer includes a sunken portion.

18. The substrate of claim 17, further comprising a passivation layer disposed on the first surface of the first dielectric layer, the passivation layer defining an opening to expose the sunken portion of the first patterned conductive layer, and wherein a width of the opening is approximately equal to a width of the sunken portion of the first patterned conductive layer.

19. The substrate of claim 1, wherein the top surface of the external connection pad has a convex shape or a concave shape.

20. A semiconductor device package, comprising:
a substrate, comprising:
a first dielectric layer having a first surface and a second surface opposite to the first surface;
a first patterned conductive layer adjacent to the first surface of the first dielectric layer;
a second patterned conductive layer adjacent to the second surface of the first dielectric layer and electrically connected to the first patterned conductive layer, the second patterned conductive layer comprising a pad and a trace adjacent to the pad; and
an external connection pad tapered from a top surface to a bottom surface, the external connection pad being disposed on the pad of the second patterned conductive layer
wherein a bottom width of the external connection pad is greater than or about equal to a width of the pad of the second patterned conductive layer,
a semiconductor device disposed on the substrate and electrically connected to the external connection pad of the substrate; and
a connection element disposed adjacent to the first surface of the first dielectric layer and electrically connected to the first patterned conductive layer.

21. The semiconductor device package of claim 20, further comprising an underfill disposed between the substrate and the semiconductor device.

22. A method for manufacturing a semiconductor device package, comprising:
providing a first dielectric layer having a first surface and a second surface opposite to the first surface;
forming a first patterned conductive layer adjacent to the first surface of the first dielectric layer;
forming a second patterned conductive layer adjacent to the second surface of the first dielectric layer and electrically connected to the first patterned conductive layer, the second patterned conductive layer comprising a pad and a trace adjacent to the pad;
forming an external connection pad on the pad of the second patterned conductive layer, wherein the external connection pad is tapered from a top surface to a bottom surface, and a bottom width of the external connection pad is greater than or equal to a width of the pad of the second patterned conductive layer;
disposing a semiconductor device on the external connection pad through an interconnect element; and
disposing a connection element on the first patterned conductive layer.

23. The method of claim 22, further comprising disposing a development dielectric layer on the second surface of the first dielectric layer, the development dielectric layer comprising a sensitizer, a weight percentage of the sensitizer in the development dielectric layer being at least 0.2%.

24. The method of claim 23, further comprising setting the bottom width of the external connection pad by performing operations that comprise setting the weight percentage of the sensitizer in the development dielectric layer.

25. The method of claim 23, further comprising filling an underfill between the development dielectric layer and the semiconductor device.

26. The method of claim 22, wherein the operation of forming the first patterned conductive layer further comprises:
    providing a passivation layer on a conductive layer;
    patterning the passivation layer to expose the conductive layer;
    laminating a carrier on the passivation layer; and
    backside etching part of the conductive layer to form the first patterned conductive layer.

27. The method of claim 26, wherein the carrier is removed prior to disposing the connection element.

* * * * *